(12) United States Patent
Rajput et al.

(10) Patent No.: US 6,931,605 B2
(45) Date of Patent: Aug. 16, 2005

(54) SIMULATED CIRCUIT LAYOUT FOR LOW VOLTAGE, LOW PAPER AND HIGH PERFORMANCE TYPE II CURRENT CONVEYOR

(75) Inventors: Sher Singh Rajput, New Delhi (IN); Sudhanshu Shekhar Jamuar, New Delhi (IN)

(73) Assignee: Council of Scientific & Industrial Research, New Delhi (IN)

( * ) Notice: Subject to any disclaimer, the term of this patent is extended or adjusted under 35 U.S.C. 154(b) by 914 days.

(21) Appl. No.: 09/820,253

(22) Filed: Mar. 28, 2001

(65) Prior Publication Data

US 2002/0194419 A1 Dec. 19, 2002

(51) Int. Cl.[7] .............................................. G06F 17/50
(52) U.S. Cl. .......................................................... 716/1
(58) Field of Search .................. 716/1; 711/1; 323/315, 323/316

(56) References Cited

U.S. PATENT DOCUMENTS

| | | | | |
|---|---|---|---|---|
| 4,329,639 A | * | 5/1982 | Davis ........................ | 323/315 |
| 4,897,596 A | * | 1/1990 | Hughes et al. .............. | 323/315 |
| 5,512,816 A | * | 4/1996 | Lambert ...................... | 323/315 |
| 6,433,528 B1 | * | 8/2002 | Bonelli et al. .............. | 323/315 |

OTHER PUBLICATIONS

Wang et al., "The Design Methods of Current –Mode nth–Order Filter", Jul. 2000, IEEE Proceedings of the 3rd World Congress o Intelligent Control and Automation, vol. 4, pp. 2570–2571.*

Rajput et al., "Low Power, High PerformanceCurrent Mirror for Portable Analogue and Mixed Mode Applications", Oct. 2001, IE Proceedings on Circuits, Devices and Systems, vol. 148, iss. 5, pp. 273–278.*

* cited by examiner

*Primary Examiner*—Vuthe Siek
*Assistant Examiner*—Sun James Lin
(74) *Attorney, Agent, or Firm*—RatnerPrestia

(57) ABSTRACT

The present invention relates to a current conveyor circuit capable of operating at very low voltages, said circuit comprising: three LVCM's and four MOSFETS, wherein LVCM1 provides a constant bias current to flow through M3, if port X is kept open and the difference between the bias current and the injected current flows through M3 if a current is injected into port X, which gets reflected at port Z due to the action of LVCM1, M3 and M4, LVCM2 maintains the drain currents of M1 and M2 constant, and LVCM3 maintains a constant tail current in the circuit.

21 Claims, 25 Drawing Sheets

SIMULATED CIRCUIT LAYOUT FOR LOW VOLTAGE, LOW PAPER AND HIGH PERFORMANCE TYPE II CURRENT CONVEYOR

FIELD OF THE INVENTION

The present invention relates to a simulated circuit layout for low voltage, low power and high performance type II current conveyor.

BACKGROUND OF THE INVENTION

Analog world is an exciting field having great potential for commercial exploitation. Most of the things do occur in nature in analog way and the processing the signal in analog domain is the natural way of signal processing. This processing does not require conversion to any other domain and hence is natural and fast. Contrary to this, the processing of the signal in digital domain requires signal conversion into digital domain from analog domain and then back conversion into analog mode after processing. The processing in digital domain may be fast enough but the processing time is actually controlled by the devices used for analog to digital and digital to analog conversion. The time used by the processor is actually too low. This also increases the hardware count for the signal processing and hence, such a system (digital signal processing) is more complex which in turn returns to slow signal processing.

The analog signal processing however is a high frequency operation, which is being further, enhanced by the use of current mode signal processing elements. There is a need to have constant development and perennial work in this field to exploit its full potential. Current conveyors (CC) are most powerful current mode signal processing block gaining importance as a practical and high performing circuit structure for future analog signal processing applications. Earlier versions of CC use conventional op amps for construction. However, CCs are available in monolithic form today. Many workers have worked towards this end and proposed bipolar/CMOS implementation of the CCII structure. Even BiCMOS implementations are also being proposed. Almost all of them operate at ±3.0 V or higher. To our knowledge only one CC is proposed which is capable of operating at ±1.0 V, but that too have lower bandwidth (<30 MHz). Moreover, the circuit structure is too complicated. The input voltage buffer used is too complicated as it uses many CMs and many current summing nodes.

Current conveyors (CC) represents the emerging class of high performing analog circuit structures, based on current mode approach in circuit design. In a current mode approach, an analog designer considers the currents as input and output variables. Thus, a current mode device is defined as the circuit structure whose all functions can be fully explained and under stood through the current flowing into its various sub-circuits without considering the input and output voltages at all. However, appropriate bias voltages must establish the proper operating conditions in circuit structures. The merits of current mode circuits include available wide frequency bandwidth, their capability to operate at low voltages and simple circuit structures. Low voltage operation is a the most favorable design technique for getting low power circuit structures, which, however, may not translate into low power circuits.

M/S Analog Devices USA has come up with few current conveyor II architectures in the form of current feedback amplifiers. AD 844 is the most popular current conveyor, which require minimum of ±3.0 power supply voltages and have the bandwidth of 10 MHz. Moreover the device has been implemented using bipolar technology. Several other chips have also been fabricated and are available commercially. Though these commercially available chips offer high bandwidth, still they suffer on account of high power consumption and need for higher bias voltages. Almost all of them are implemented in bipolar technology.

Analog designers are now concentrating on the design of low power and necessarily low voltage circuits to cope up with the demands of portable instruments and mobile communication gadgets. Low power circuits are preferred in non-portable instruments also. The merits of a current conveyor encourage one to use them in power miser, low voltage and high performing current mode circuits. They are becoming the industry standard for high frequency applications. The proposed CC structure is another major step forward in this direction.

Current conveyors are very versatile analog signal processing blocks and are now replacing the conventional operational amplifiers in most of the signal processing applications. Some of the applications of CCs are:

Analog Active Filters

This is an important class of applications for CCs. Analog filters find many uses, which include i. Entertainment electronics ii. Control circuits for highly noisy industrial environment. This type of environment is also present during the launch of a spacecraft and the circuits have to perform up to the mark.

iii. In hand held portable instruments and communication gadgets.

Space Application

When the designer intends to design the instruments for space exploration, he faces the challenges on four equally important fronts viz., power consumption, size, weight and reliability. Hence there arises a need to have reliable low power high performing circuits. Thus the CCII may prove to be a boon in the design of such low voltage low power scientific instruments for space exploration and strategic military applications.

Medical Electronics

Medical aids are increasingly being employed as life saving aids. Particularly, instruments like pace makers and hearing aids are being used increasingly. The requirements of medical aids are small size and low power consumption. CCII can be used successfully in the construction of these medical aids.

General Instruments

General-purpose instruments operating at higher voltages and consuming high power require cooling system in form of a fan or a water-cooling arrangement. This increases the instrument weight and reduces the portability and thus the optimum utilization of the instrument. The low voltage low power CCII can be used in the design of such measuring instruments to increase the portability.

It may be noted that the potential applications of CCIIs lie in the high performance like high bandwidth and low power consumption (low voltage operation).

A CC as shown in FIG. 1 is a three (or more) port network, which are designated as port X, port Y and port Z. Port X is a dual port suitable for input as well as output signals. For current signals, it acts as a input port with very low input impedance, but is an output port for voltage signals. Port Y is only voltage-input port with high input impedance. Port Z is a current output port. For the injected current into port X, the output port Z may sink or source the current. Further investigations into CCs led to the emergence of few new circuit architectures. Thus there are two types of the classifications of the CCs, one of which is based on the input port Y characteristics and the other on the port Z characteristics. Based on the input port Y characteristics, CCs have been classified as CC type I (CCI), CC type II (CCII), and CC type III (CCIII). When classification is based on port Z, the CCs are classified into CC⁺ and CC⁻. The port properties of a general CC structure are given as:

$$\begin{bmatrix} i_Y \\ V_X \\ i_Z \end{bmatrix} = \begin{bmatrix} 0 & A & 0 \\ 1 & 0 & 0 \\ 0 & B & 0 \end{bmatrix} \begin{bmatrix} V_Y \\ i_X \\ V_Z \end{bmatrix} \quad (1)$$

For CCI, A=1 and a voltage $V_Y$ will be connected at port Y and voltage at port X, ($V_X$) follows $V_Y$ independent of current injected into port X. The voltage $V_Z$ produced at port Z is arbitrary. In CCII, A=0 and the current into port Y is zero, offering very high input impedance at port Y. For CCIII, A=−1, which implies that $I_Y$=−$I_X$. This property is utilized in monitoring the current in circuit paths. For CC⁺ structure, B=1, while for CC⁻ structure, B=−1. Thus CCs form nine subcategories. These are CCI⁺, CCI⁻, CCI composite outputs, CCII⁺ CCII⁻, CCII with composite outputs, CCIII⁺, CCIII⁻, and CCIII with composite outputs.

Elements of a Current Conveyor

Current mirror (CM) is an integral part of almost all-analog circuit architectures. Hence when we talk of low voltage circuits than it is necessary to have their sub circuits which are capable of operating at low voltages. To meet this challenge there is need to design high performing CMs which are capable of operating at low voltages. These Low voltage current mirrors (LVCMs) are used in the design of proposed CCII structure. The LVCM is depicted in FIG. 2.

The performance indexes of a LVCM on which the performance of a CM can be assessed are:
 i. Low input impedance ideally zero,
 ii. High output impedance ideally infinite
 iii. High current transfer bandwidth ideally infinite
 iv. High dc current transfer range ideally infinite
 v. Rail to rail input and output voltage swing capability.

Most of the analog circuit structures are hybrid in nature, which utilize both current and voltage mode signal processing elements. Operational amplifier is one such example, which uses both, the current mode circuits such as current mirrors, and a differential pair, which is based on voltage mode concept. Thus, for the completeness of a the any current mode circuit, it is essential to examine few low-voltage analog-voltage mode circuits also which are suitable for being used in current mode devices. Their applications into the low voltage signal processing analog cells demand a fresh look.

Voltage Buffer, one of the extremely powerful circuits and most popularly used to transfer the input voltage, impressed at a port normally known as input port, to the other port (normally termed as output port), possessing the high current sourcing/sinking capabilities. The properties of these analog circuits include:
 Accurate voltage tracking, necessary to get exact voltage transfer without any error.
 Low output impedance, required to increase the current sinking/sourcing capability of these circuits.
 High input impedance decreases the input signal loading.
 High dynamic range provides larger signal range for input voltage signals.
 Low power dissipation gives high battery life and smaller size.

These properties facilitate the analog designer to use these blocks for isolation between the input port and output port. High input impedance is necessary to avoid the loading of the input signals. They also provide high current drive capability to the output port. Hence they can also be termed as voltage buffer. These blocks find wide-ranging uses. Most common among these uses which are suitable for current mode signal processing analog cells are their use in current conveyors, current feedback amplifiers, operational floating amplifiers etc. They are employed at input port of a current conveyor for transferring the voltage at the current input port. When it is used at the output port of a CCII, the resultant circuit structure acts as a current feedback amplifier, generally a high performance device. Four terminal floating nullers (FTFNs) are the most popular current mode circuits, which are suitable for being used as a general purpose current mode block. This block is used in FTFNs to form its voltage-input port. Even the voltage mode circuits uses this block very successfully in operational amplifiers. It is placed at the input end of operational amplifiers.

Voltage transfer blocks were implemented using several circuit structures. Almost all implementations use a differential pair. Differential pair is one of the very important analog cells, which is used in many circuit applications originating due to real word problems. Design of low voltage rail to rail voltage transfer cells is very important, as they require further investigation into various new circuit structures. They are called operational trans-conductors also. They are used to transfer the input voltage signals from a port to another low impedance port.

Several circuit schematics are available in the literature, for being used as voltage transfer block. However, all these blocks are operated at relatively higher supply voltages. Their input and output voltage swings are also limited. To overcome these deficiencies, several circuit structures are proposed, which are capable of providing rail to rail voltage transfer. However, a few structures are suitable to operate at low voltage levels. Thus examination of new circuit structures capable of operating at low voltage and providing rail to rail voltage transfer capability, is an extremely important task.

Source coupled pairs, most commonly used to form a differential input stage. It is most popular two MOSFET sub circuits in monolithic analog circuit structures. The usefulness this circuit stems from the fact that cascades of this source coupled MOSFETs are directly coupled to one another without inter stage coupling capacitor and that differential input characteristics are required in many types of analog circuits.

An important objective of the differential amplifier design is minimization of the dc bias current flowing into the input leads of the circuits and maximization of differential input resistance. MOSFETs are preferred device for such a configuration to have low input bias currents.

Description of Software

Implementations of the circuit in silicon require prior proving for the circuit structure to save time, material and money. The prior proving of the circuit design can be done however with some accurate methods, such as:
 By circuit implementation on a chip
 By simulation though computer.

Earlier methods of circuit proving include the implementation of the proposed circuit structure on a silicon chip. Because of enormous complexity of modern integrated circuits, enormous costs are involved in prototype implementation. The proposed circuit structure may fail to deliver the desired output. Modem computer aided circuit analysis however provide the cheep and fast alternative. Thus computer aided circuit analysis is essential to have the prior circuit performance that is almost impossible to obtain with laboratory prototype measurements. Computer aided circuit analysis can provide Prior design verification for confidence building.

Before hand performance analysis, which reduces the time of implementation and the cost involved in the development of the final product.

The most common software being used for such evaluation and is being used as a very essential tool in the development of analog integrated circuits is the SPICE circuit simulator. SPICE is being considered as the industry standard in the circuit simulation regime. The acronym SPICE stands for Simulation Program with Integrated Circuit Emphasis. SPICE is general-purpose circuit simulator program that can simulate the electronic circuit performance without really assembling the same as a chip or on a breadboard. SPICE can perform various analyses of electronic circuits: the operating point, a time domain response, and small signal frequency response. It is a very versatile program, which is widely used both in industries and universities. Initially SPICE has been designed only on mainframe computers. Later on a PC based version was developed which is being called as PSPICE. PSPICE can run on IBM compatible PC. M/S. Microsim USA is one of the companies, which designs and upgrades the PSPICE.

PSPICE uses the same algorithms as SPICE. It is equally useful for simulating all type of analog and digital circuits in wide range of applications, both by discrete components for use on a breadboard or to design a monolithic chip. Necessary control statements are stored in a file, which is called as the circuit file. These statements fully describe the circuit. The SPICE simulator reads the circuit file. Each statement is self-contained and independent; the statements do not interact with each other. SPICE (or PSPICE) is easy to learn and use.

OBJECTS OF THE INVENTION

The main object of the present invention is to provide a simulated circuit layout design for low voltage, low power and high performance conveyors for analog signal processing applications.

Another object of the present invention is to provide use of the layout design in development of a prototype IC chip on silicon.

Still another object of the present invention is to provide an alternative voltage buffer which can be very conveniently used in as input block for a current feedback amplifier or an operational floating current conveyor.

SUMMARY OF THE INVENTION

The present invention relates to a current conveyor circuit capable of operating at very low voltages, said circuit comprising: three LVCM's four MOSFETS, wherein LVCM1 provides a constant bias current to flow through M3, if port X is kept open and the difference between the bias current and the injected current flows through M3 if a current is injected into port X, which gets reflected at port Z due to the action of LVCM1, M3 and M4, LVCM2 maintains the drain currents of M1 and M2 constant, and LVCM3 maintains a constant tail current in the circuit.

Accordingly, the present invention relates to a current conveyor circuit capable of operating at very low voltages, said circuit comprising: three LVCM's and four MOSFETS, wherein LVCM1 provides a constant bias current to flow through M3, if port X is kept open and the difference between the bias current and the injected current flows through M3 if a current is injected into port X, which gets reflected at port Z due to the action of LVCM1, M3 and M4, LVCM2 maintains the drain currents of M1 and M2 constant, and LVCM3 maintains a constant tail current in the circuit.

In an embodiment of the present invention, the current conveyor comprises of one PMOS LVCM.

In another embodiment of the present invention, LVCM2 is a PMOS LVCM.

In still another embodiment of the present invention, the current conveyor comprises of two NMOS LVCM's.

In yet another embodiment of the present invention, LVCM1 is a single input, double output NMOS LVCM.

In one more embodiment of the present invention, LVCM2 is a single input single output NMOS LVCM.

In one another embodiment of the present invention, the LVCM uses the conventional CM structure in conjunction with a level shiftier transistor at the input port.

In an embodiment of the present invention, the LVCM imparts high swing capability.

In another embodiment of the present invention, the LVCM's ensure maximum possible input and output voltage swings, giving rise to rail to rail capability to voltage transfer blocks.

In still another embodiment of the present invention, adaptive biasing technique is used in the LVCM.

In yet another embodiment of the present invention, the adaptive biasing technique increases the input voltage swing and decreases the offset current.

In one more embodiment of the present invention, the MOSFET's M1 and M2 form a differential pair.

In one another embodiment of the present invention, the voltage at port voltage at port Y gets transferred to port X due to the action of the differential pair.

In an embodiment of the present invention, the current conveyor may further comprise of a capacitance C connected between the drain of M1 and gate of M2.

In another embodiment of the present invention, the capacitance is connected to provide compensation.

In still another embodiment of the present invention, the current conveyor may further comprise of a resistance connected between the gate terminal of M1 and M2.

In yet another embodiment of the present invention, the resistance enhances the frequency response of the circuit.

In one more embodiment of the present invention, the MOSFET's M3 and M4 form a current mirror.

In one another embodiment of the present invention, the current conveyor operates at a voltage range of ±1V.

The current conveyor being proposed in this application has simple circuit architecture, is modular in concept (which is very favorable requirement for modern VLSI circuits), and has the capability to operate at ±1V supply voltage with a bandwidth better than 100 MHz.

The present simulated layout design proves to be of great advantage in terms of providing high frequency, low voltage and simple alternative to the conventional operational amplifiers.

Thus these circuit structures can form one of the general purpose analog current made modules for the analog library to be used in the development of various analog circuit structures. This may prove to be one of the major steps in the modular analog circuit design, a field being developed for advanced analog circuits on the tune of digital design.

BRIEF DESCRIPTION OF THE ACCOMPANYING DRAWINGS

In the accompanying drawings

DESCRIPTION OF THE PREFERRED EMBODIMENTS

For the proposed structure we have designed a application specific LVCMs and voltage buffers (VBs).

Low Voltage Current Mirror (LVCM)

Figure 1:
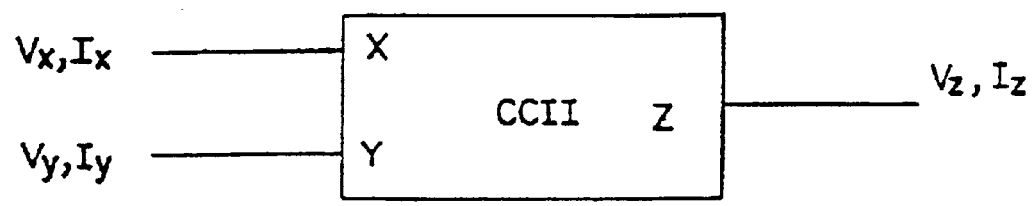
FIG. 1 represents a current conveyor (CC).
Figure 2:
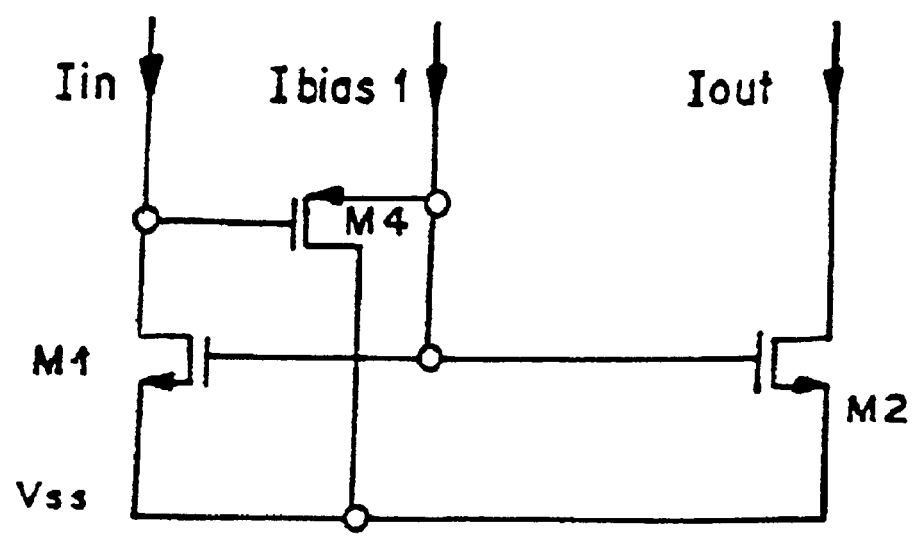
FIG. 2 represents the proposed circuit for implementation of LVCM.

Refer to FIG. 2. The proposed circuit for implementation of LVCM uses the conventional CM structure in conjunction with a level shifter transistor at the input port to impart the high swing capability to the proposed CM. A capacitive and resistive compensation techniques were also used to enhance the bandwidth of the proposed CM. The CMs based on level shifter approach generally suffer from the flow of undesirable current at low input current levels. This current is called as offset current and is major bottleneck in LVCMs design. We introduce a adaptive biasing technique for the proposed LVCMs which increases the input voltage swing and decreases the offset current.

The design assumes the 0.8 $\mu$m technology parameters for p-Spice simulations. Transistor M4 is forced to operate in sub-threshold region by selecting a very low current to flow through its channel. The biasing current comes from the CM formed by M6, M7 and M8. The aspect ratio of these components are kept in such a way that the current available at the drain of transistor M8 is at such a low level that it forces the M4 into sub-threshold region. A capacitance C is used for compensation and is connected between the drain of M1 and gate of M2. A resistance is also connected between the gate terminals of M1 and M2. This resistance enhances the frequency response of the circuit.

Circuit Architecture

Figure 3:
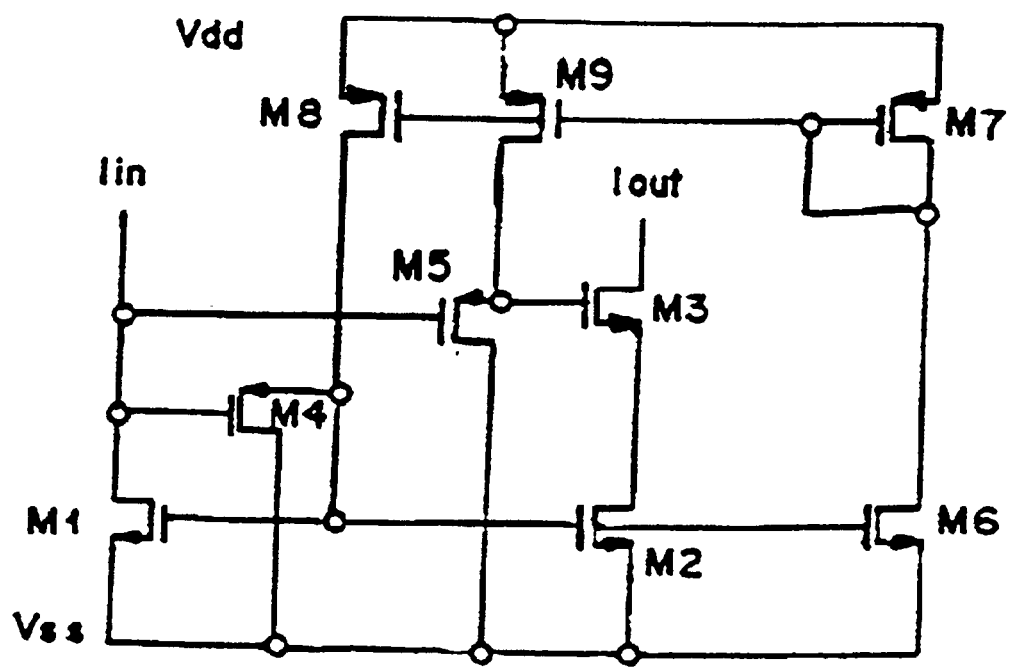
FIG. 3 represents the complete circuit complete circuit of the LVCM.
Figure 4:
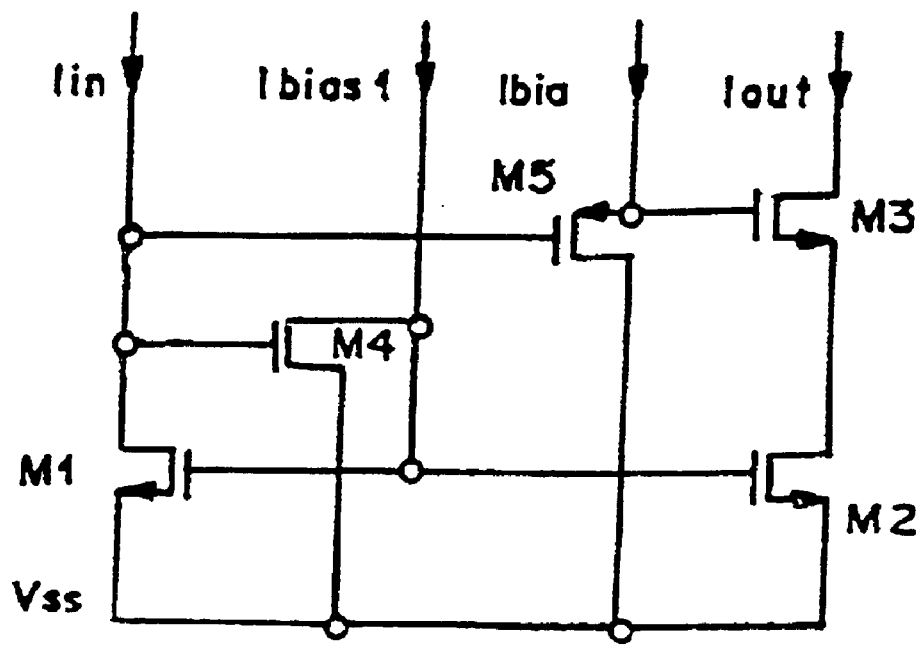
FIG. 4 represents the circuit schematic of the LVCM of the LVCM circuit shown in FIG. 3.

The complete circuit is shown in FIG. 3. However, to explain the circuit functioning, the Circuit schematic is shown in the FIG. 4.

Simulation Results

The most important parameters necessary to evaluate the performance of a LVCM are given as:

Input resistance

Output resistance

Frequency response

Current transfer ratios (both dc and ac currents).

The evaluation of the proposed circuit has been done with the above parameters in mind. Transistor aspect ratios (W/L) are given in Table 1.

TABLE 1

Aspect ratios of the transistors used in NMOS LVCM

| MOSFETs | TYPE | Aspect ratios (W/L) |
|---|---|---|
| M1, M2 | NMOS | 48 $\mu$m/1.6 $\mu$m |
| M3 | NMOS | 48 $\mu$m/0.8 $\mu$m |
| M4 | PMOS | 12 $\mu$m/0.8 $\mu$m |
| M5 | PMOS | 12 $\mu$m/0.8 $\mu$m |
| M6 | NMOS | 4.8 $\mu$m/1.6 $\mu$m |
| M7, M8 | PMOS | 48 $\mu$m/0.8 $\mu$m |
| M9 | PMOS | 0.8 $\mu$m/16 $\mu$m |

Figure 5:
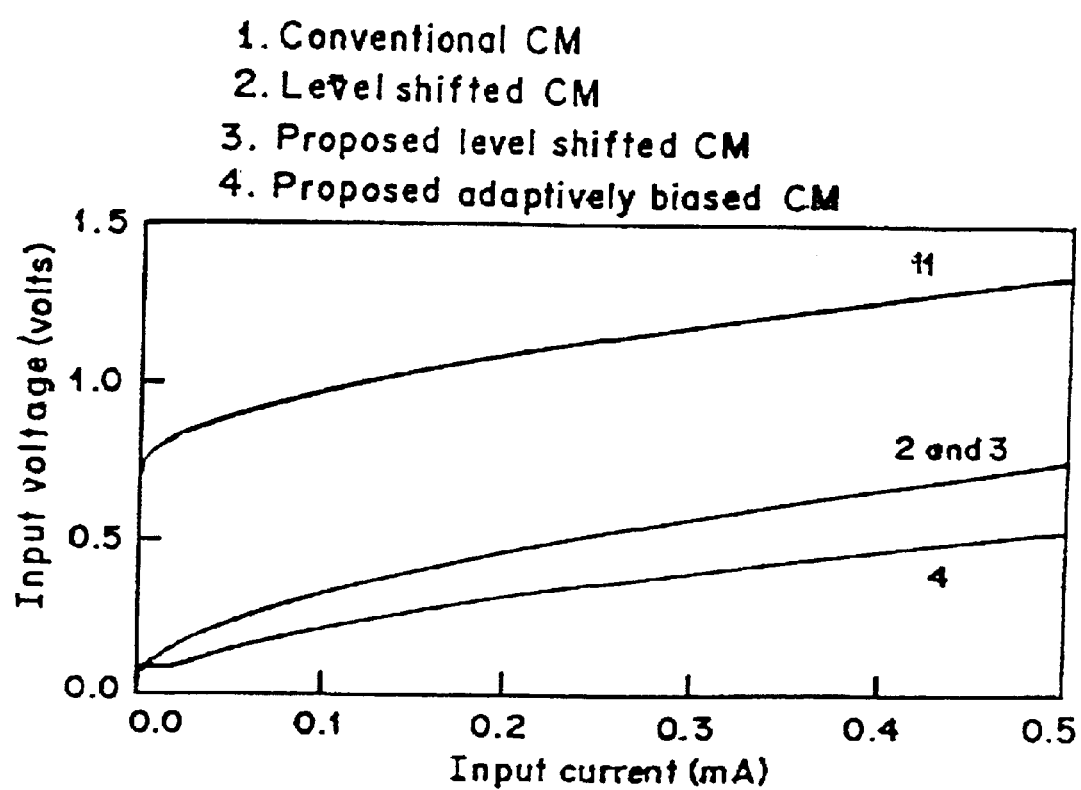
FIG. 5 represents the input voltage present due to the injection of input current.
Figure 6:
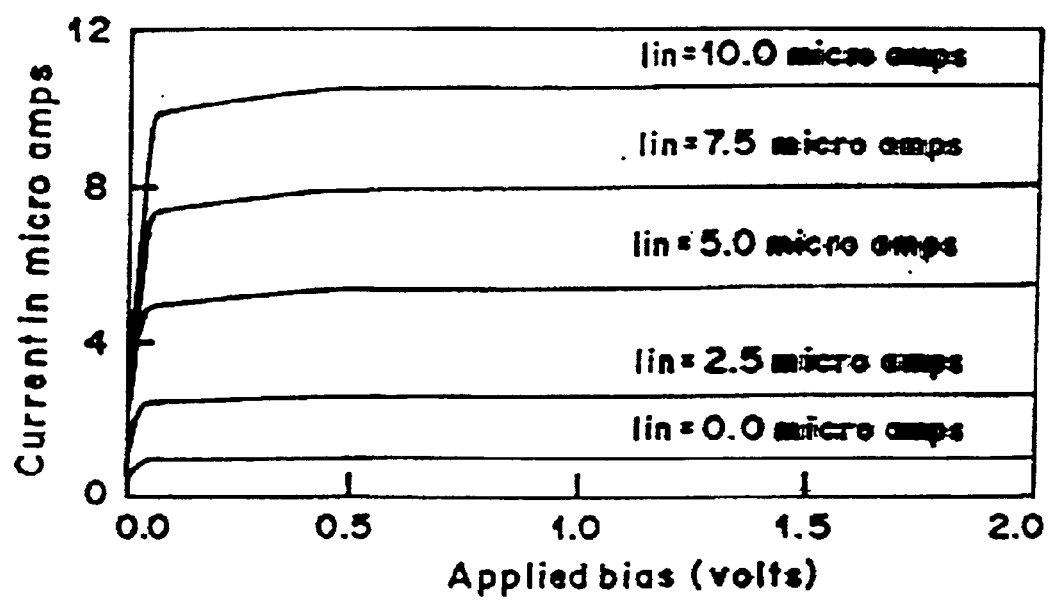
FIG. 6 represents the output current characteristics with adaptive biasing at low voltage levels.
Figure 7:
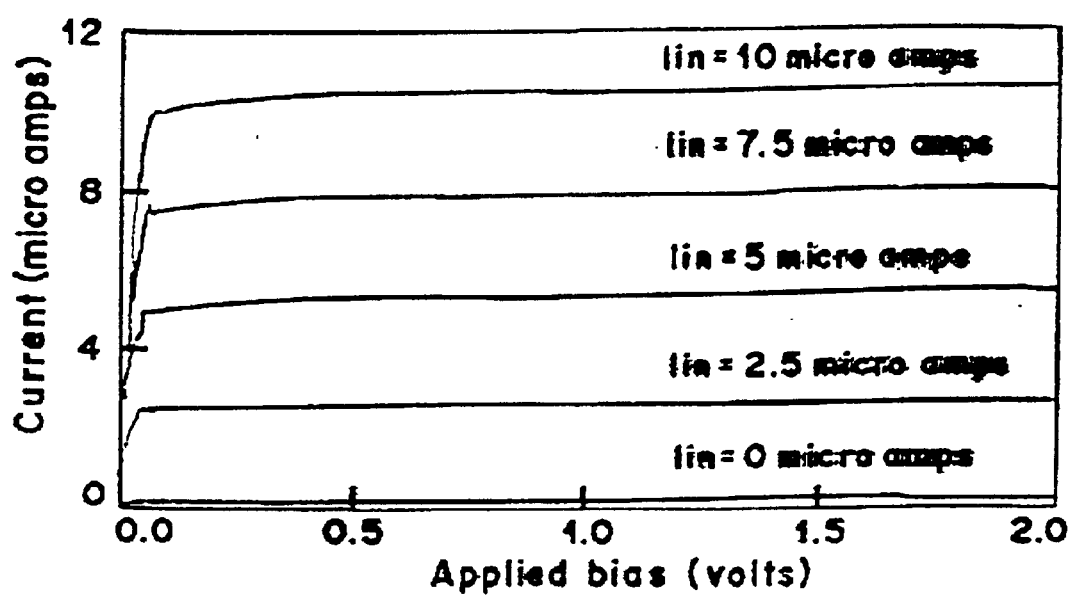
FIG. 7 represents the output current characteristics without adaptive biasing at low voltage levels.
Figure 8:
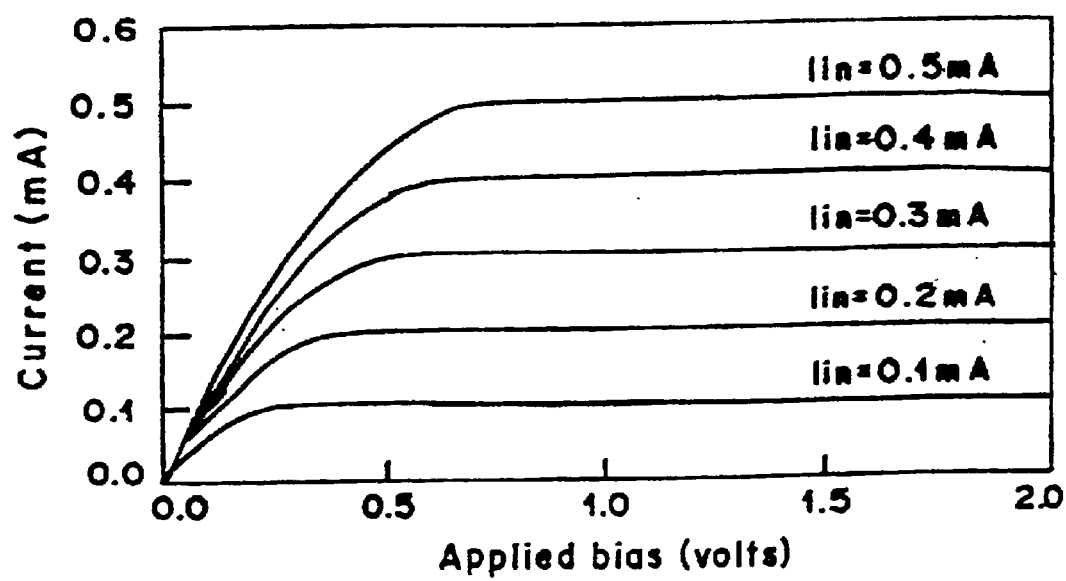
FIG. 8 represents the output current characteristics at high current levels.

The input voltage present due to the injection of input current ranging from 1 $\mu$A to 500 $\mu$A is shown in FIG. 5. Output current characteristics with and without adaptive biasing at low voltage levels are shown in FIGS. 6 and 7 respectively. FIG. 8 shows the output current characteristics at high current levels.

Figure 9:
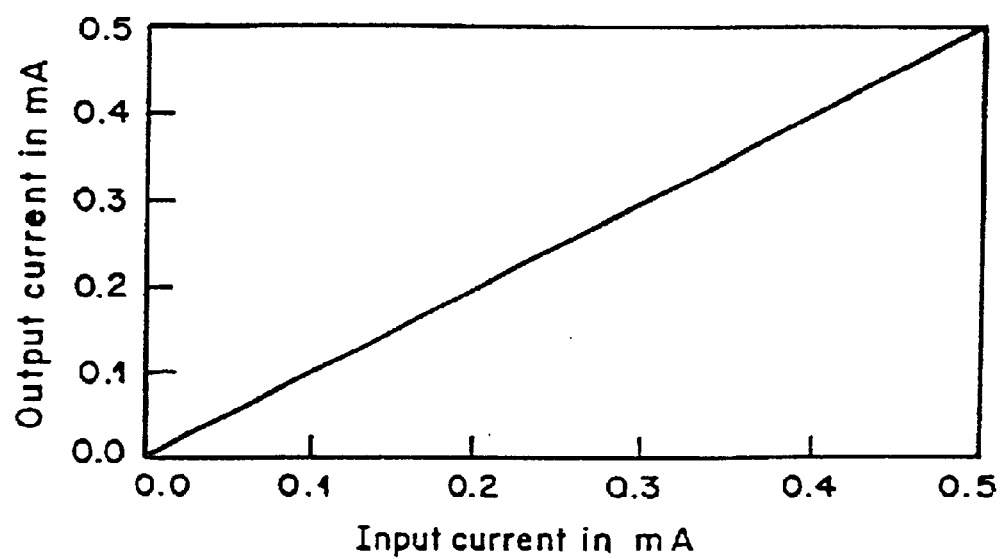
FIG. 9 represents the input current transfer characteristics.
Figure 10:
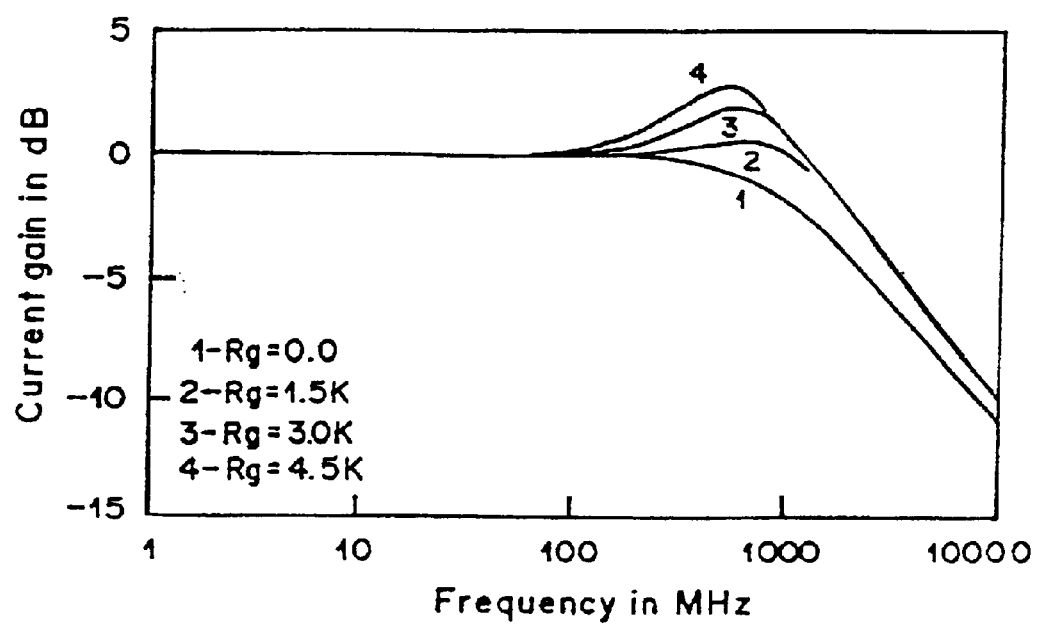
FIG. 10 represents the effect of gate resistance on the frequency response.
Figure 11:
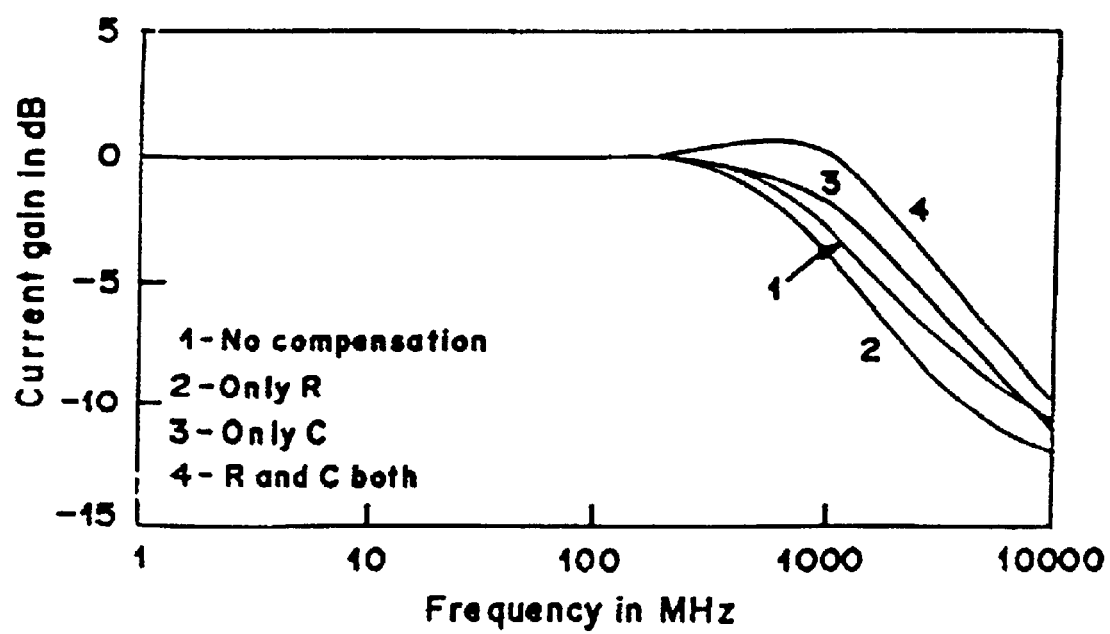
FIG. 11 represents the influence of various compensation techniques.

Input current transfer characteristic is shown in FIG. 9. FIG. 10 depicts the effect of gate resistance on the frequency response of the structure. Influences of various compensation techniques are shown in FIG. 11.

Figure 12:
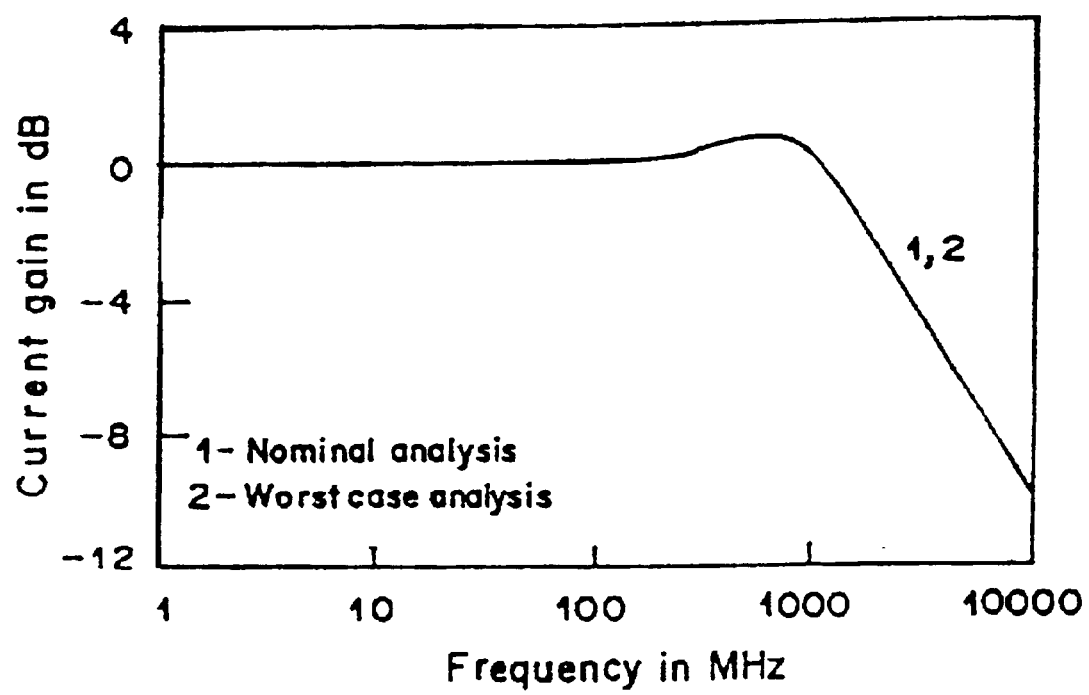
FIG. 12 represents the effect of temperature variation over the LVCM's bandwidth.
Figure 13:
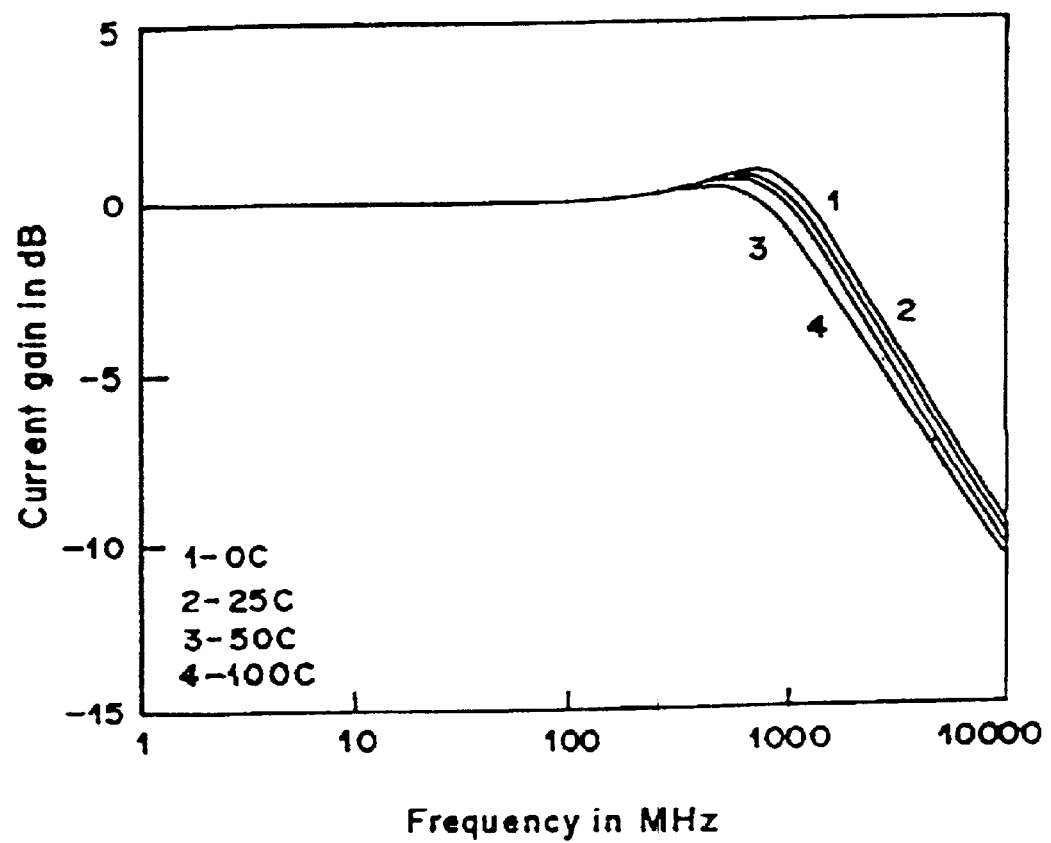
FIG. 13 represents the effect of parameter variation over the LVCM's bandwidth.

The effect of temperature variation over the LVCM bandwidth is shown in FIG. 12. FIG. 13 shows that the parameter variation has little effect over the band of the proposed LVCM.

Proposed Voltage Buffer

The heart of this block is also the differential input stage. Input voltage signal is applied at one of the gate of the source coupled differential pair. The voltage will appear at the another gate, if the currents flowing through the MOSFETs are equal. The proposed structure imparts low impedance characteristics to the voltage source. However, the maximum current sinking capacity of the voltage source depends on the current source. Any increase in the current sinking capability increases the power consumption of the circuit structure. The demerits of the above architecture are:

Constant flow of standby current increases the power consumption of the circuit structure.

The current mirror governs the output sinking capability of the circuit architecture.

Higher current sinking capacity in turn increases the power consumption.

This structure can not be used in low power circuits.

The detail analysis of the circuit follows.

Circuit Description

Figure 14:
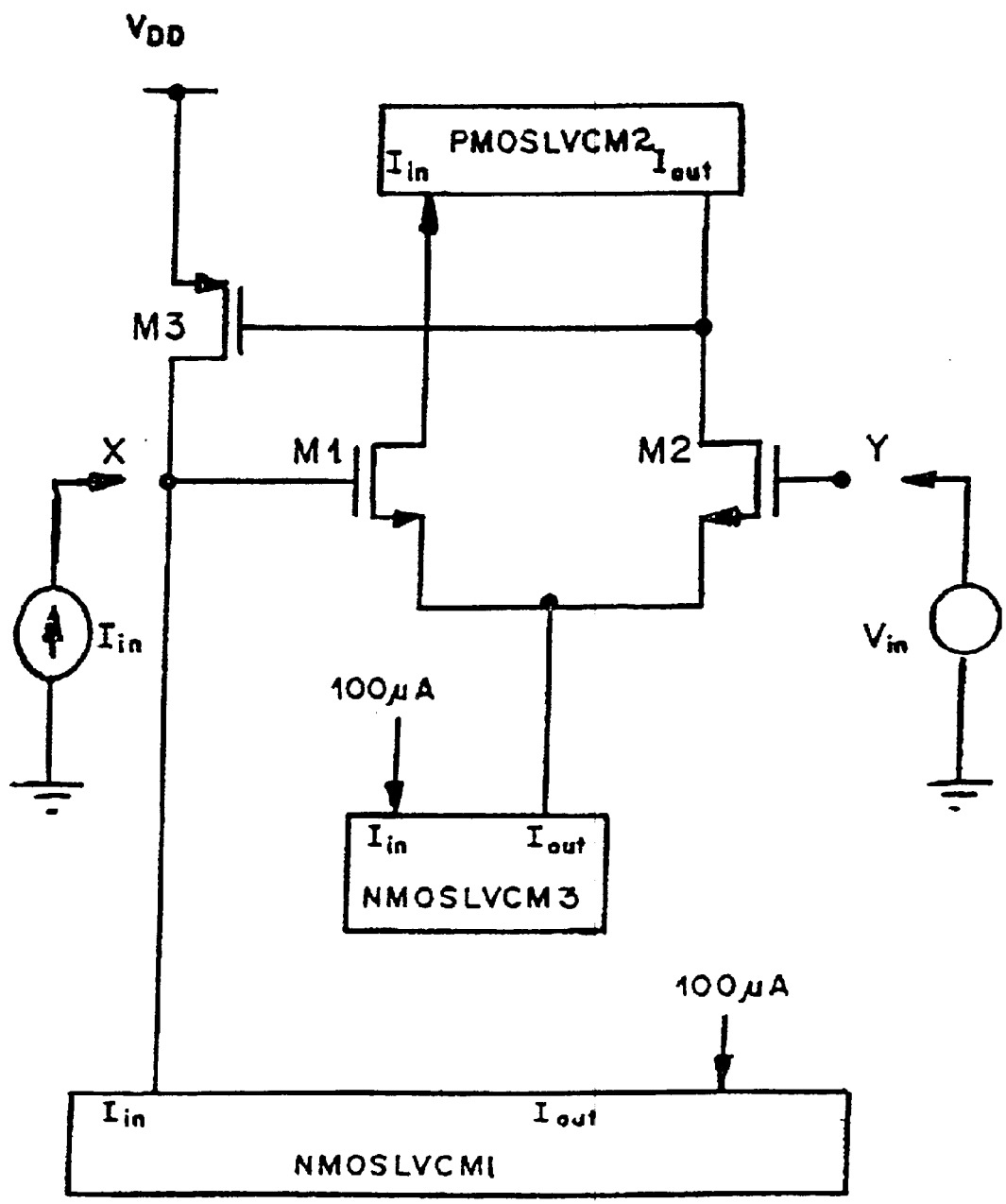
FIG. 14 represents the proposed circuit.

The circuit of the proposed schematic is shown in FIG. 14, in which a differential pair is used to transfer the voltage from input-port to the output port. The tail current of the circuit is kept constant by using LVCM. Similarly, a LVCM is used to maintain drain currents of M1 and M2 constant. LVCMs ensure maximum possible input and output voltage swings, giving rail to rail capability to the voltage transfer block.

Assuming that both the MOSFETs M1 and M2 operate in saturation region, simple circuit analysis yields:

$$I_{D1} = \frac{\beta}{2}(V_{in} - V_T)^2 \quad\quad 1$$

$$I_{D2} = \frac{\beta}{2}(V_{out} - V_T)^2 \quad\quad 2$$

The current mirror CM2 maintains $I_{D1}=I_{D2}$, giving us:

$$V_{in}=V_{out} \quad\quad 3$$

Simulation Results

The important parameters for rail to rail voltage transfer blocks are:

Very high input impedance.

Very low output impedance.

DC voltage transfer characteristics, which tell about the input and output voltage range.

AC voltage transfer bandwidth, which tells about the usable frequency response.

P-spice simulation was carried out to determine these parameters. The W/L ratios for M1, M2, and M3 are taken as 24 µm/1.6 µm, 24 µm/1.6 µm, and 120 µm/1.6 µm respectively. The input impedance of the structure was found to be $10^{18}$ Ω, which may be expected from any CMOS structure. The output impedance of the structures is 10 Ω only.

Figure 15:
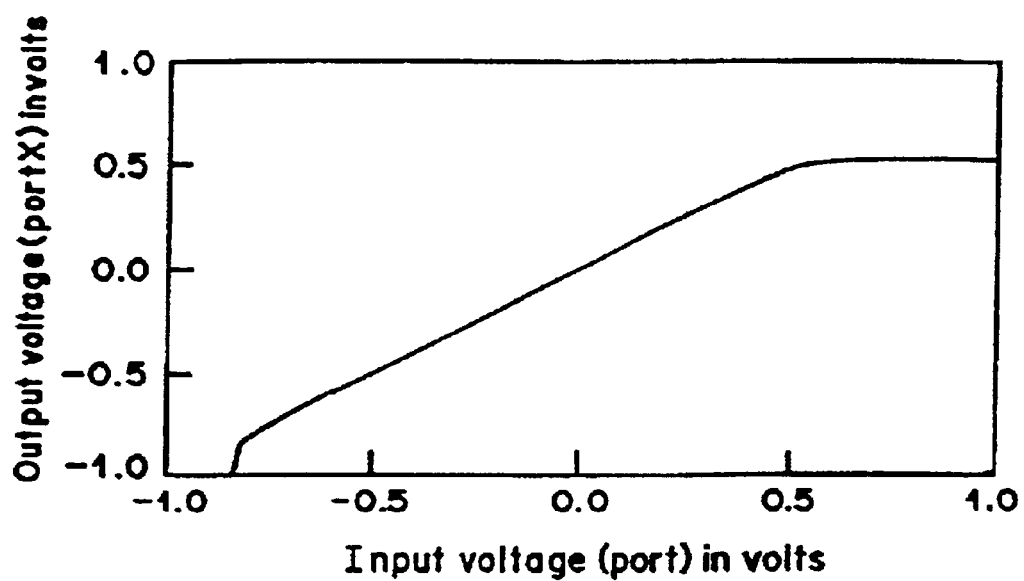
FIG. 15 represents the dc voltage input output characteristics.
Figure 16:
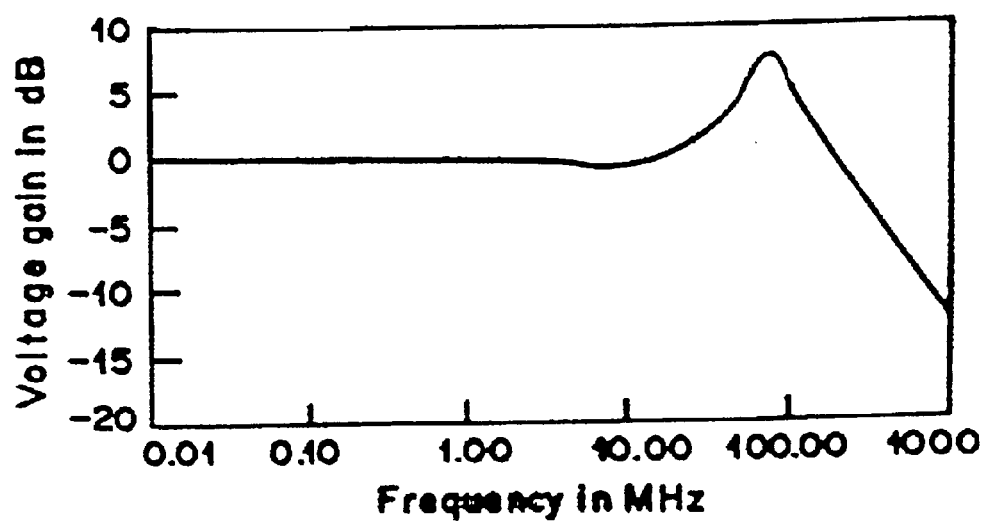
FIG. 16 represents the bandwidth characteristics of the voltage buffer.

When the supply voltage is ±1.0 V, the dc voltage input output characteristics are given in FIG. 15. The output voltage follows the input voltage for input voltage ranging between –1.0 V to 1.0 V. For a input voltage ranging between –1.0 V to 1.0 V, the output voltage swing is near rail to rail (–0.75 V to 0.75 V). The dc voltage transfer ratio was evaluated at 0.981 as against ideally 1.00. However, ac voltage transfer function has been evaluated ideally as 1.00. The bandwidth characteristics of the voltage buffer are shown in FIG. 16. The bandwidth is found to be in excess of 300 MHz.

Proposed CCII Structure

Figure 17:
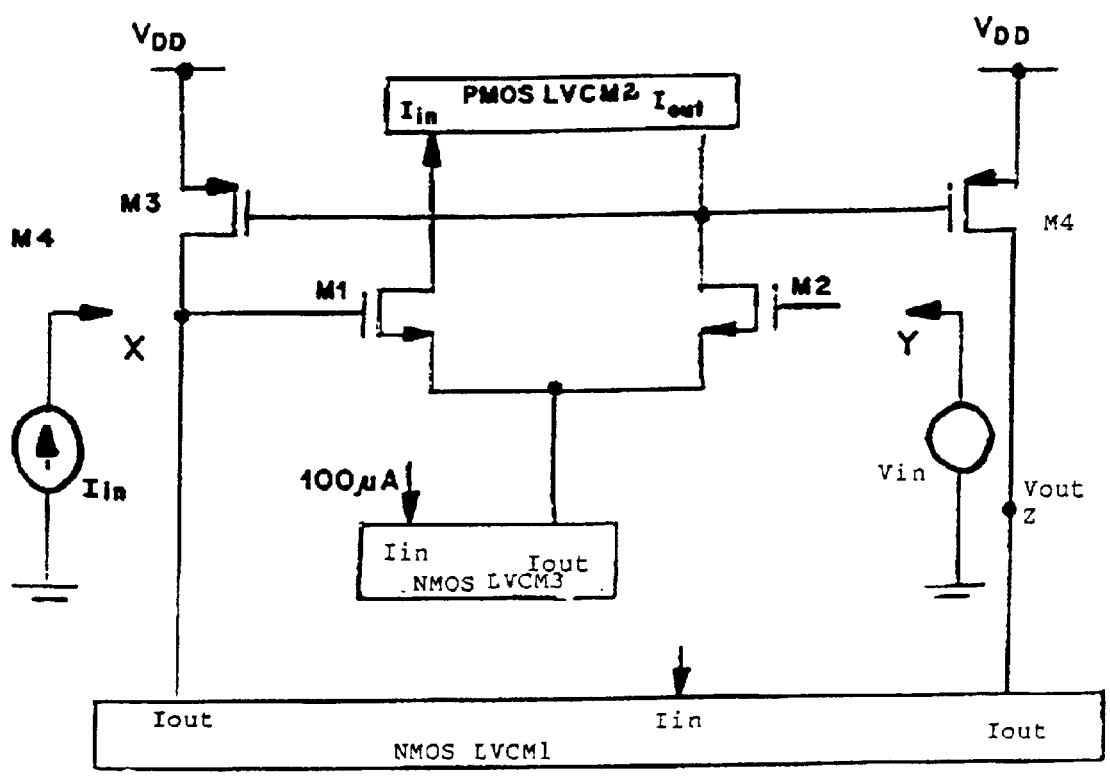
FIG. 17 represents the proposed CCII structure.

The proposed CCII structure is shown in FIG. 17. The structure is based on the utilization of LVCMs and VBs discussed in previous sections. The operation of the circuit is quite simple and can be understood by knowing the properties and operations of these building blocks. The circuit uses three LVCMs. One of which is PMOS and the other two are NMOS type. NMOS CMs are double output and single output LVCMs. A constant bias current set by the LVCM1 flows through M3 if port X is kept open. When a current is injected into port X, the difference between the bias current and injected current flows through M3. This current get reflected at port Z due to the action of LVCM 1 and CM formed by M3 and M4. Similarly, the current drawn from port X gets reflected to port Z. The voltage applied at port Y, get transferred to port X due to the actions of differential pairs.

Figure 18:
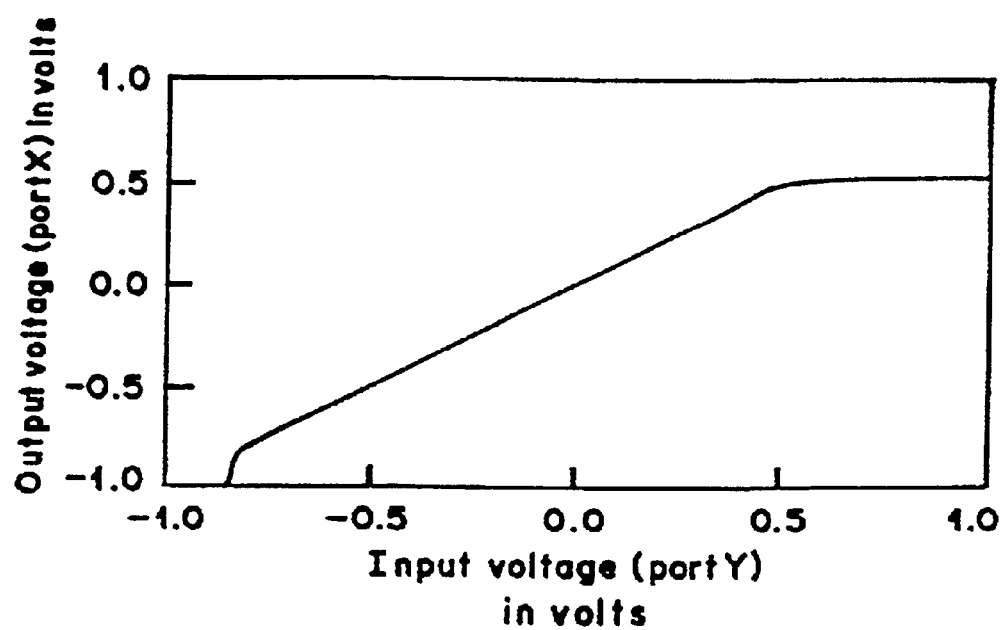
FIG. 18 represents the dc input current transfer characteristics.
Figure 19:
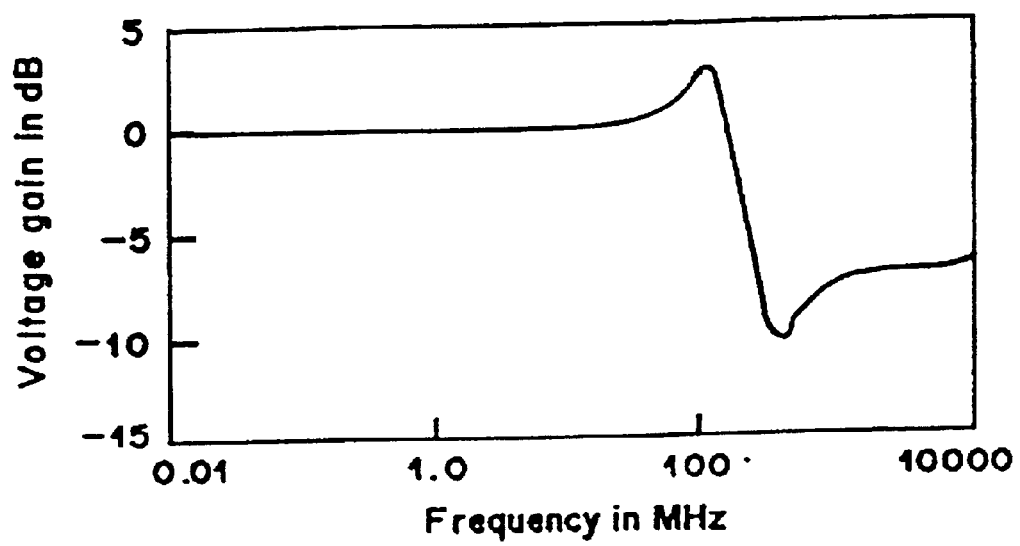
FIG. 19 represents the frequency response of the proposed circuit for current transfer.

The proposed circuit has been simulated for operation as a CCII. The W/L ratios for M1, M2, M3 and M4 are taken as 24 µm/1.6 µm, 24 µm/1.6 µm, 120 µm/1.6 µm and 120 µm/1.6 µm respectively. For biasing current of 150 µA, the dc input current transfer characteristics are shown in FIG. 18. The frequency response of the proposed circuit for current transfer is shown in FIG. 19.

Figure 20:
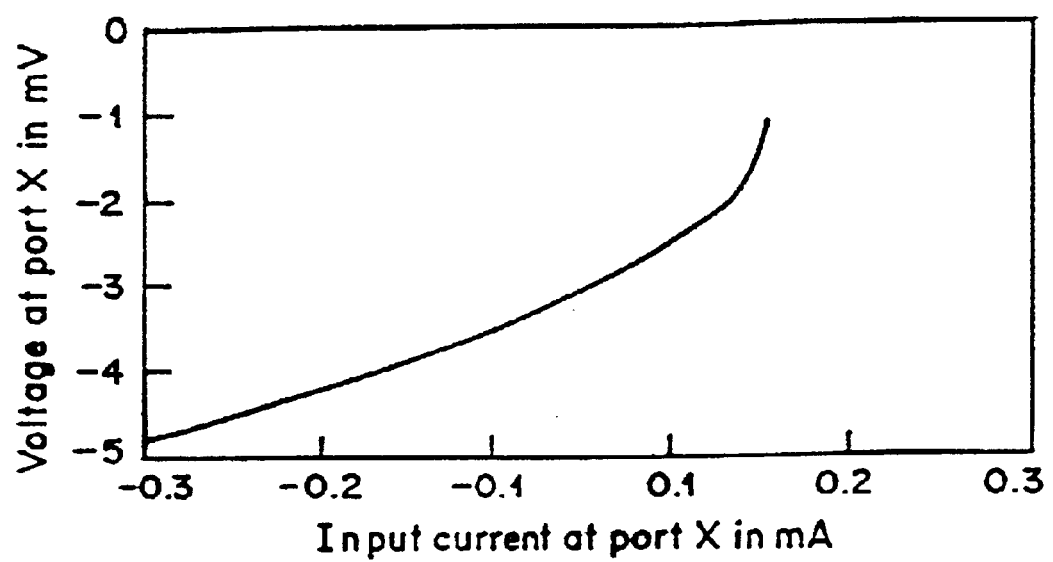
FIG. 20 represents the voltage developed at the input terminal due to the injection of the input current.
Figure 21:
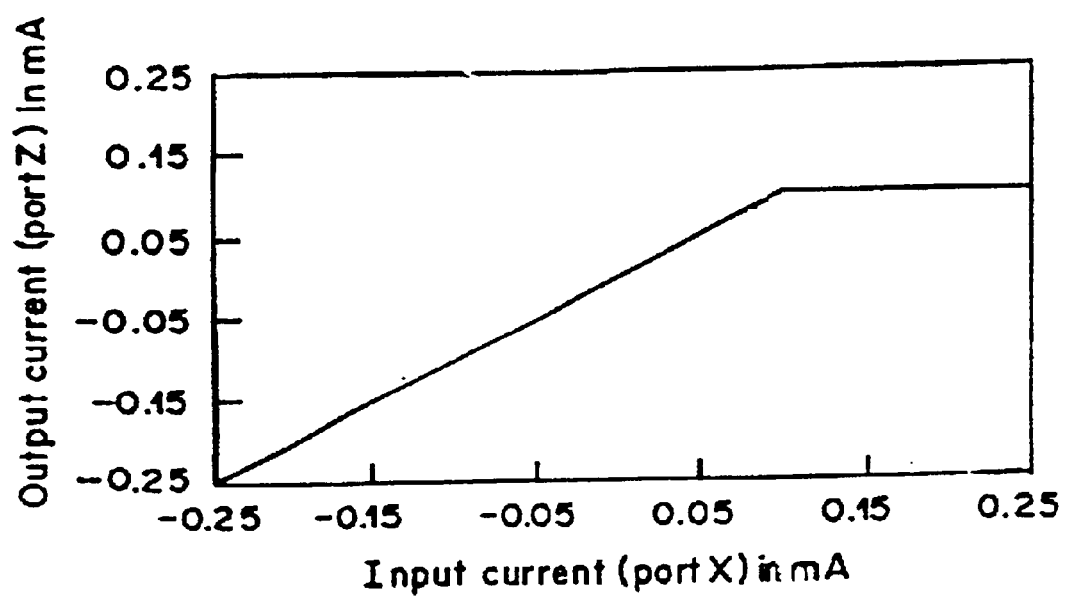
FIG. 21 represents the dc input current transfer.
Figure 22:
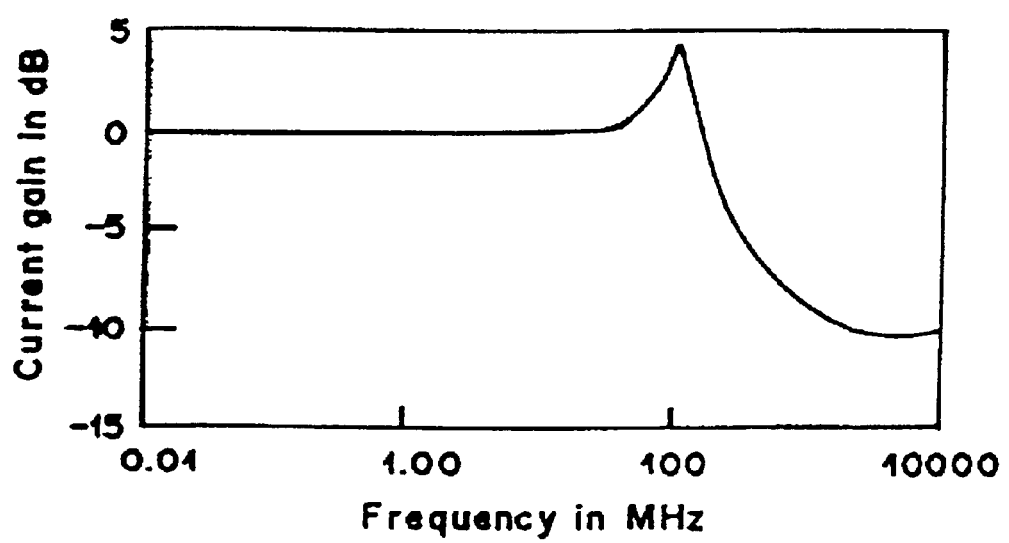
FIG. 22 represents the current transfer bandwidth.

The voltage developed at the input terminal due to the injection of the input current is shown in FIG. 20. The dc input current transfer is shown in FIG. 21. Current transfer bandwidth is shown in FIG. 22.

Figure 23:
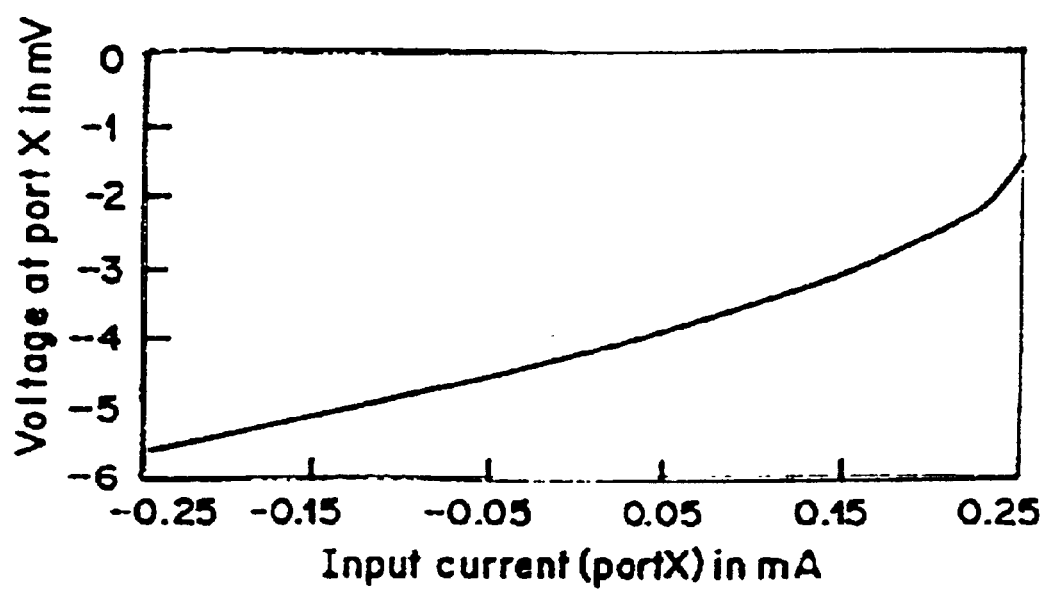
FIG. 23 represents the graph between input bias current and the current transfer.
Figure 24:
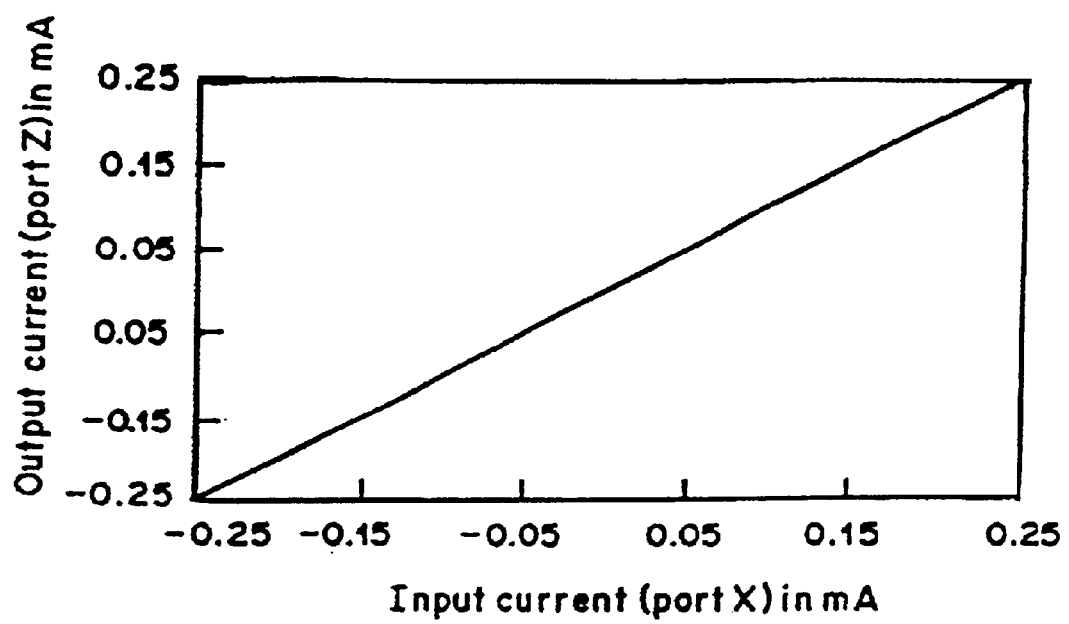
FIG. 24 represents the graph between input bias current and the current transfer bandwidth.
Figure 25:
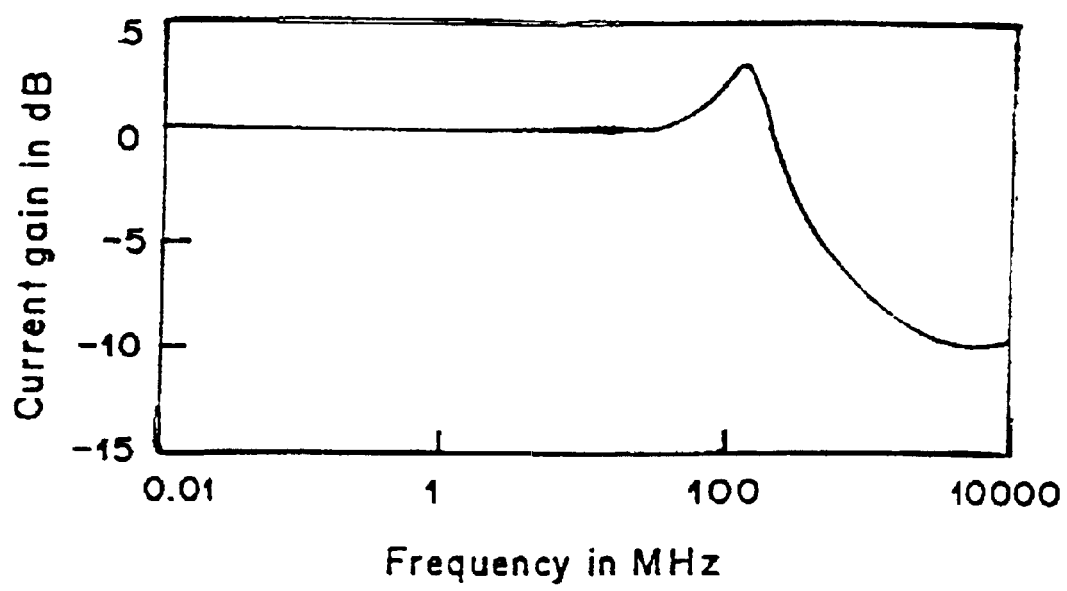
FIG. 25 represents the current transfer bandwidth.

When the input bias current is increased to 250 µA, the current transfer takes place up to 250 µA as shown in FIG. 23. Current transfer bandwidth also increases as shown in FIG. 24.

Applications:

The proposed structure can be used in the design of

1. Current feedback amplifiers
2. Active filters for use in mobile communication equipments.
3. In the development of analog signal processing equipments for use in entertainment and control signals.
4. In space electronics where high frequency low power and low voltage systems are required.
5. In medical electronics.
6. In the design of transconductors for voltage to current converters.
7. In mathematical functions.
8. In analog and digital chips for current monitoring.

The proposed circuit has the following merits:

i. Low power consumption (<2.0 mW).

ii. Low voltage supply operation (±1.0 V).

iii. Current transfer ratio
   a) DC≈0.99
   b) AC≈0.99
   c) Current transfer bandwidth≈100 MHz iv. Voltage transfer ratio
   a) DC≈0.99
   b) AC≈0.99
   c) Voltage transfer bandwidth≈100 MHz
   d) Input voltage transfer range from –0.7 V to 0.7 V.

What is claimed is:

1. A current conveyor circuit capable of operating at very low voltages, said current conveyor circuit comprising:

a port X for providing an input current;

a port Y for providing an input voltage;

a first low voltage current mirror (LVCM), LVCM1, having a first output port coupled to the port X and a second output port coupled to an output port Z;

a voltage buffer (VB) circuit, coupled between the port X and the port Y;

a second LVCM, LVCM2, coupled to the VB circuit, for maintaining constant drain currents of the VB circuit;

a third LVCM, LVCM3, coupled to the VB circuit, for maintaining a constant tail current in the VB circuit;

A third MOSFET M3, and a fourth MOSFET, M4, respectively, with gates coupled together and further coupled to an output port of LVCM2;

a reference voltage provided to sources of M3 and M4, respectively;

a third MOSFET M3 drain coupled to the part X and the first output port of LVCM1, LVCM1 providing a constant bias current to flow through M3; and a fourth MOSFET M4 drain coupled to the output port Z and the second output port of LVCM1.

2. The current conveyor circuit as claimed in claim 1, wherein the current conveyor circuit comprises of one PMOS LVCM.

3. The current conveyor circuit as claimed in claim 1, wherein LVCM2 is a PMOS LVCM.

4. The current conveyor circuit as claimed in claim 1, wherein the current conveyor circuit comprises of two NMOS LVCM's.

5. The current conveyor circuit as claimed in claim 1, wherein LVCM1 is a single input, double output NMOS LVCM.

6. The current conveyor circuit as claimed in claim 1, wherein LVCM2 is a single input, single output NMOS LVCM.

7. The current conveyor circuit as claimed in claim 1, wherein each LVCM uses a conventional current mirror structure in conjunction with a level shifter transistor at its input port.

8. The current conveyor circuit as claimed in claim 7, wherein each LVCM imparts high swing capability.

9. The current conveyor circuit as claimed in claim 8, wherein the LVCM's ensure maximum input and output voltage swings, giving rise to rail to rail capability to voltage transfer blocks.

10. The current conveyor circuit as claimed in claim 7, wherein an adaptive biasing technique is used in each LVCM.

11. The current conveyor circuit as claimed in claim 10, wherein the adaptive biasing technique increases input voltage swing and decreases offset current.

12. The current conveyor circuit as claimed in claim 1, wherein the VB circuit comprises:

a first MOSFET, M1, having a first gate, a first source and a first drain, the first gate coupled to the port X, the first drain coupled to an input port of LVCM2, the first source coupled to an output port of LVCM3; and a second MOSFET, M2, having a second gate, a second source and a second drain, the second gate coupled to the port Y, the second drain coupled to the output port of LVCM2, the second source coupled to the first source of M1 and further coupled to the output port of LVCM3, wherein M1 and M2 form a differential pair.

13. The current conveyor circuit as claimed in claim 12, wherein voltage at the port Y gets transferred to the port X due to an action of the differential pair.

14. The current conveyor circuit as claimed in claim 12, wherein the current conveyor circuit further comprises a capacitance C connected between the first drain of M1 and second gate of M2.

15. The current conveyor circuit as claimed in claim 14, wherein the capacitance is connected to provide compensation.

16. The current conveyor circuit as claimed in claim 12, wherein the current conveyor circuit further comprises a resistance connected between the first and second gates of M1 and M2, respectively.

17. The current conveyor circuit as claimed in claim 16, wherein the resistance enhances frequency response of the current conveyer circuit.

18. The current conveyor circuit as claimed in claim 1, wherein the M3 and M4 form a current mirror.

19. The current conveyor circuit as claimed in claim 1, wherein the current conveyor circuit operates at a voltage range of ±1V.

20. The current conveyor circuit as claimed in claim 1, when the port X is open, LVCM1 provides the constant bias current to flow through M3.

21. The current conveyor circuit as claimed in claim 20, wherein a current source is provided to the port X, for providing a difference current between the constant bias current and an injected current to flow through M3, the combination of LVCM1, M3 and M4 reflecting the difference current at the port Z.

* * * * *

UNITED STATES PATENT AND TRADEMARK OFFICE
CERTIFICATE OF CORRECTION

PATENT NO. : 6,931,605 B2  Page 1 of 1
DATED : August 16, 2005
INVENTOR(S) : Sher Singh Rajput and Sudhanshu Shekhar Jamuar It is certified that error appears in the above-identified patent and that said Letters Patent is hereby corrected as shown below:

Title page,
Item [54], Title, "PAPER" should read -- POWER --.

Signed and Sealed this

Twenty-eighth Day of March, 2006

JON W. DUDAS
*Director of the United States Patent and Trademark Office*